United States Patent [19]
Rawlings

[11] Patent Number: 5,469,526
[45] Date of Patent: Nov. 21, 1995

[54] OPTICAL FIBER SUPPORT FOR PRINTED CIRCUIT BOARDS

[75] Inventor: David L. Rawlings, Bayville, N.Y.

[73] Assignee: Porta Systems Corp., Syosset, N.Y.

[21] Appl. No.: 178,929

[22] Filed: Jan. 7, 1994

[51] Int. Cl.[6] .................................................. G02B 6/36
[52] U.S. Cl. ......................................................... 385/135
[58] Field of Search ................................. 385/134–137

[56] References Cited

U.S. PATENT DOCUMENTS

| | | | |
|---|---|---|---|
| 4,217,030 | 8/1980 | Howarth | 385/64 |
| 4,687,289 | 8/1987 | DeSanti | 385/135 |
| 4,765,708 | 8/1988 | Becker et al. | 385/135 |
| 4,770,357 | 9/1988 | Sander et al. | 242/54 R |
| 4,792,203 | 12/1988 | Nelson et al. | 385/135 |
| 4,820,007 | 4/1989 | Ross et al. | 385/135 |
| 4,850,901 | 7/1989 | Smith et al. | 385/135 X |
| 4,861,134 | 8/1989 | Alameel et al. | 385/135 |
| 5,100,221 | 3/1992 | Carney et al. | 385/135 |
| 5,142,606 | 8/1992 | Carney et al. | 385/134 |
| 5,155,785 | 10/1992 | Holland et al. | 385/89 |
| 5,241,617 | 8/1993 | Peacock et al. | 385/135 |
| 5,253,320 | 10/1993 | Takahashi et al. | 385/135 |
| 5,329,067 | 7/1994 | Abe et al. | 385/135 X |

FOREIGN PATENT DOCUMENTS

PCT/US89/
05153 5/1990 WIPO.

*Primary Examiner*—John D. Lee
*Attorney, Agent, or Firm*—Hoffmann & Baron

[57] ABSTRACT

An arrangement for supporting an optical fiber and related optical components in a raised position above a surface of a printed circuit board on which electrical components are mounted includes a support which defines an endless, oval raceway for receiving one or more optical fibers, legs mounted on the support and secured to the printed circuit board for supporting the raceway defining support above the surface of the printed circuit board a predetermined distance so that the support does not interfere with the electrical components mounted on the printed circuit board, and one or more ramps joined to the raceway and extending from the raceway substantially to the surface of the printed circuit board. The ramps provide support for the optical fibers over portions of the fibers where they are coupled to an opto-electronic transmitter or receiver mounted on the printed circuit board.

10 Claims, 4 Drawing Sheets

OPTICAL FIBER SUPPORT FOR PRINTED CIRCUIT BOARDS

BACKGROUND OF THE INVENTION

1. Field of the Invention

The present invention relates to electro-optical systems, and more particularly relates to arrangements for supporting optical fibers and related optical components on an electronic printed circuit board.

2. Description of the Prior Art

U.S. Pat. No. 4,861,134, which issued on Aug. 29, 1989 to George M. Alameel, et al., discloses an "organizer" for optical fibers and related optical components, such as optical splices and splitters. The organizer is used for securing the optical fibers to a printed circuit board and to allow the optical fibers and components to interface with electrical components mounted on the printed circuit board. The organizer defines troughs for receiving the optical fibers and components, and defines between the troughs two openings of unused space.

There are several disadvantages with the optical fiber organizer disclosed in the Alameel, et al. patent. First, the organizer is mounted directly on the printed circuit board and thus occupies considerable board space. The organizer leaves little room on the printed circuit board for mounting electrical components. The electrical components may only be mounted in the unused space provided by the two openings in the organizer.

Second, the Alameel, et al. patent describes what appears to be a co-planar arrangement of optical fibers and their associated opto-electronic components, such as the optical transmitter and receiver. The transmitter and receiver are secured to the organizer and reside in substantially the same plane as the optical fibers. One disadvantage of this design is that additional space must now be provided on the organizer to accommodate the transmitter and receiver, which may be rather large. Such a requirement may interfere with the preferred routing of the optical fibers on the organizer. To fit on the organizer, the transmitter and receiver might have to be positioned such that the optical fibers they interface with exceed the minimum bend radius. As is well known, unlike copper wires, optical fibers loose their effectiveness when bent in a radius smaller than the minimum bend radius.

Another disadvantage of co-planarly arranging the transmitter and receiver with the optical fibers is that the organizer must now be situated on or close to the surface of the printed circuit board to avoid long lead lengths between the circuit board and the transmitter and receiver.

OBJECTS AND SUMMARY OF THE INVENTION

It is an object of the present invention to provide a support for optical fibers and related optical components, which support may be used in connection with an electrical printed circuit board.

It is another object of the present invention to provide an optical fiber support mountable on a printed circuit board, which support maintains the minimum bend radius of the optical fibers mounted on the support.

It is yet another object of the present invention to provide an optical fiber support for use with printed circuit boards, which support allows opto-electronic components which interface with the optical fibers to be mounted directly on the printed circuit board.

It is a further object of the present invention to provide an arrangement for supporting optical fibers and related optical devices on an electronic printed circuit board which occupies minimal space on the printed circuit board.

It is still a further object of the present invention to provide an arrangement for supporting optical fibers and related optical devices on a printed circuit board, which arrangement provides three dimensional support for the optical fibers.

It is yet a further object of the present invention to provide an optical fiber management system for use in interconnecting optical fibers and related optical components to opto-electronic or electronic components, which system provides three dimensional bend radius control for the optical fibers.

It is yet another object of the present invention to provide an optical fiber support which overcomes the disadvantages of known optical fiber supports, including that which is described in U.S. Pat. No. 4,861,134.

In accordance with one form of the present invention, an arrangement for supporting an optical fiber and related optical components in a raised position above a surface of a printed circuit board on which electrical components are mounted includes a support which defines a raceway or channel for receiving one or more optical fibers, legs mounted on the support and secured to the printed circuit board for supporting the raceway defining support above the surface of the printed circuit board a predetermined distance so that the support does not interfere with the electrical components mounted on the printed circuit board, and one or more ramps joined to the raceway and extending from the raceway substantially to the surface of the printed circuit board. The ramps provide support for the optical fibers over portions of the fibers where they are coupled to an opto-electronic transmitter or receiver mounted on the printed circuit board.

The raceway is preferably formed as an endless oval loop with a curvature that does not exceed the minimum bend radius of the optical fiber received by it. The ramps may also include sidewalls which may be curved to help support the optical fiber, and the curvature is selected such that it does not exceed the minimum bend radius of the optical fiber.

The arrangement may include a cover which may be removably mounted to the support to at least partially cover the raceway. The arrangement may further include tabs spaced apart along the length of the raceway and which extend over the raceway to help retain the optical fibers within the raceway.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 4 is a top plan view of the arrangement shown in

FIG. 1 including a cover.

DETAILED DESCRIPTION OF THE PREFERRED EMBODIMENTS

Figure 1:
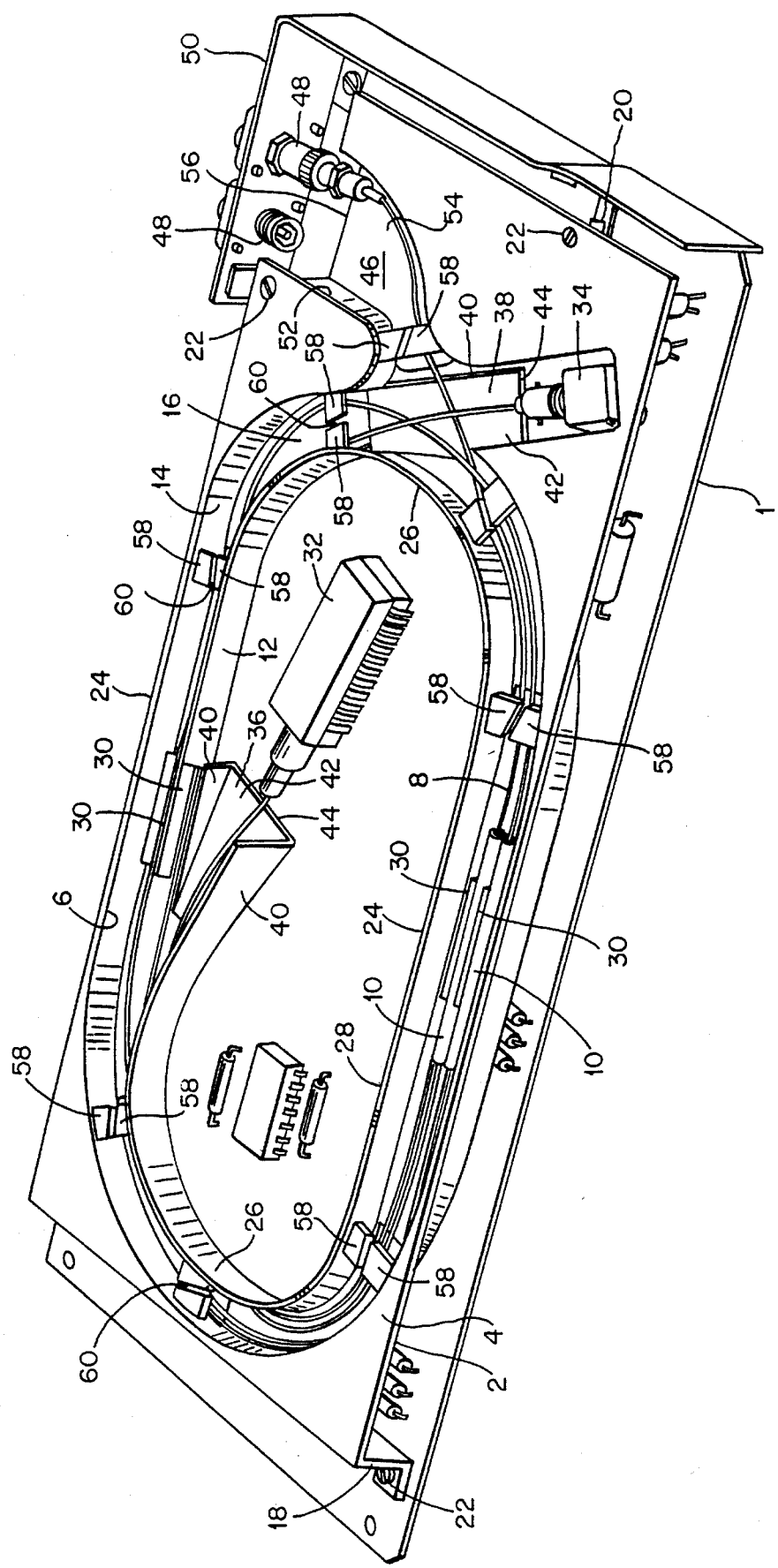
FIG. 1 is a top perspective view of an arrangement formed in accordance with the present invention for supporting optical fibers and related optical components above a printed circuit board.
Figure 2:
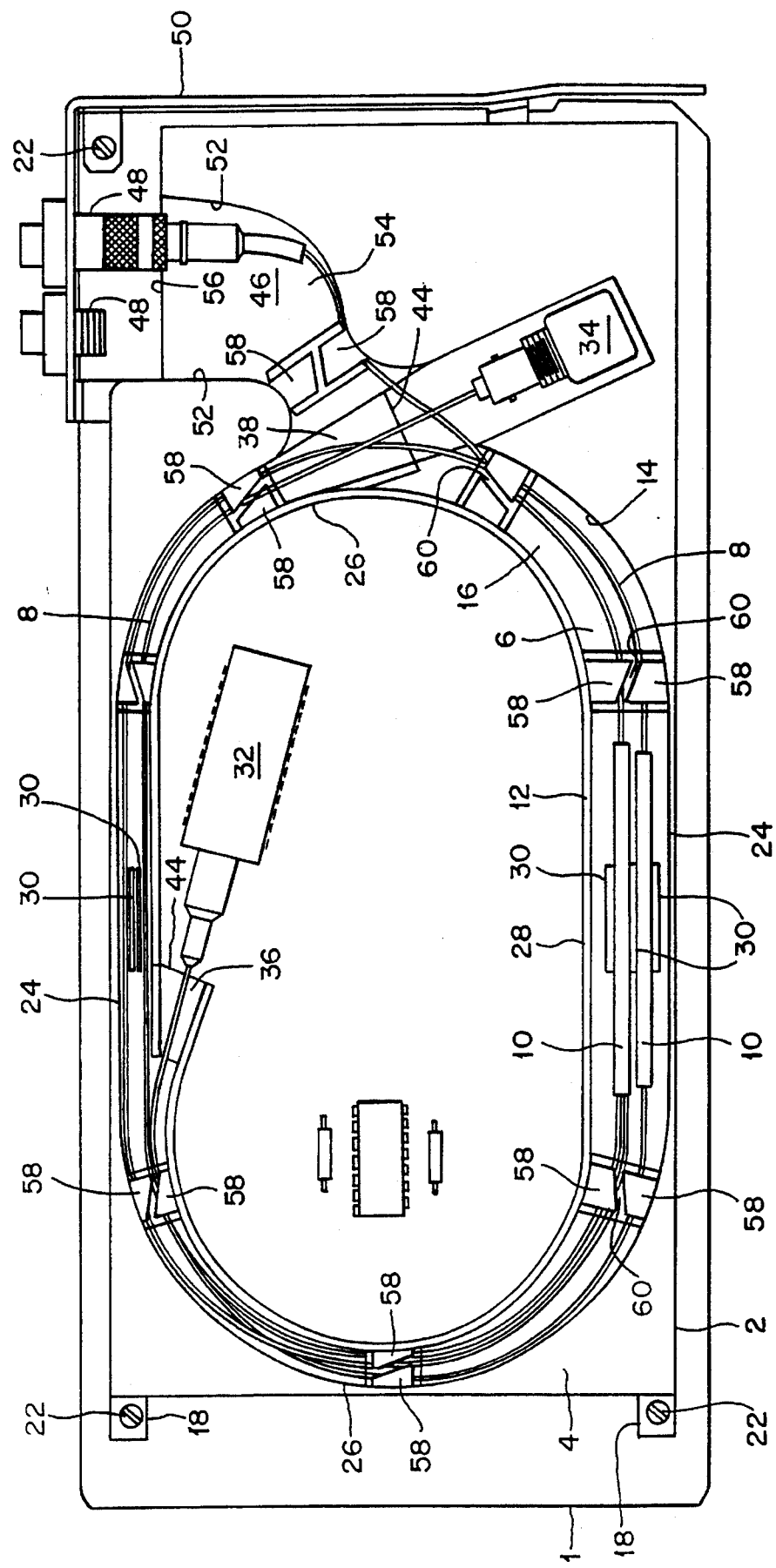
FIG. 2 is a top plan view of the arrangement shown in FIG. 1.
Figure 3:
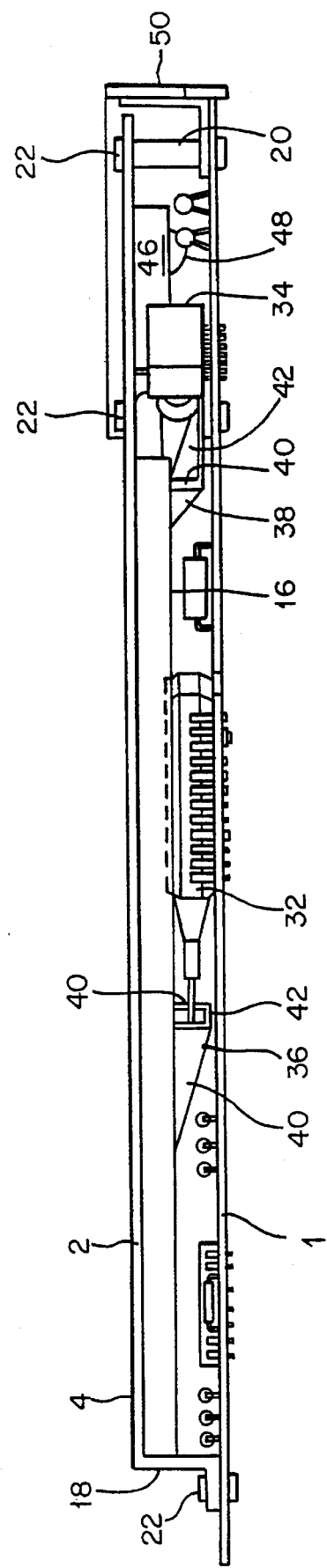
FIG. 3 is a front side view of the arrangement shown in FIG. 1.

Referring initially to FIGS. 1–3 of the drawings, it can be seen that an arrangement for supporting optical fibers and related optical components above a surface of a printed circuit board 1 includes a support 2 preferably made of a molded plastic material and having a flat upper surface 4. The support 2 is molded to form a raceway 6 or channel recessed in its upper surface 4 for receiving one or more optical fibers 8 and related optical components 10, such as optical splitters, couplers and splices. More specifically, the support 2 defines the raceway 6 with an inner wall 12 and an opposite outer wall 14 and a bottom wall 16 joined between the lower edges of the inner and outer walls 12, 14. The optical fibers 8 are received by the raceway and are supported by one or more of the inner, outer and bottom support walls 12–16.

The arrangement further includes legs 18 or posts 20 extending perpendicularly downwardly from the support 2 and secured to the printed circuit board 1 by screws 22 or the like. The legs 18 and posts 20 are dimensioned to secure the support 2 to the printed circuit board 1 in a position that is a predetermined distance above the printed circuit board.

As can be seen from FIGS. 1 and 3, the raceway 6 is only so deep and the legs 18 and posts 20 raise the support 2 above the surface of the printed circuit board 1 so that the bottom wall 16 of the raceway does not interfere with electrical components mounted on the printed circuit board. Thus, with the present invention, substantially all of the surface of the printed circuit board 1 is made available for mounting electronic circuitry, as the support 2 and raceway 6 do not rest on the surface of the printed circuit board.

As shown in FIG. 2, the raceway 6 is preferably formed as an endless, elongated oval loop having opposite longer sides 24 and opposite shorter sides 26 and having a predetermined curvature. The curvature of the raceway is such that it does not exceed (i.e., it is at most equal to) the minimum bend radius of the optical fiber 8 it receives. The raceway 6 resides substantially in a plane which is parallel to and spaced apart from the plane in which the printed circuit board surface resides.

The raceway 6 may include a widened portion 28 in one or both of its longer sides 24. The widened portion 28 is provided to accommodate one or more optical components 10, such as a splice, coupler or splitter, and to allow the optical device to be positioned in line and in the present track of the optical fiber 8 in the raceway without creating the need for an additional bend. As is well known in the art, optical fiber couplers and other devices require several inches of space on either side of the actual fiber coupling to avoid bending the fiber beyond the minimum bending radius. With the elongated oval track that the raceway takes, the present invention provides the space required to fit several optical devices 10 side-by-side within the raceway 6 and allows a sufficient straight path on both sides of the devices before the optical fiber 8 curves around the raceway.

The support 2 includes upstanding resilient fingers 30 disposed in a parallel arrangement within the widened portion 28 and also on the opposite longer side 24 of the raceway to removably secure the optical components 10 in place. The fingers 30 extend upwardly from the bottom wall 16 defining the raceway 6, and are wedged apart by the optical device 10 when the device is mounted between adjacent fingers in the raceway.

One of the problems with prior art supports for optical fibers, and in particular the "organizer" disclosed in U.S. Pat. No. 4,861,134, is that the support rests on the surface of the printed circuit board, occupying much needed space for circuitry, but also secures the opto-electronic components, such as the transmitter and receiver, to the support. The prior art support must provide sufficient space to accommodate these rather large devices, and this may create logistic problems in laying out the preferred path of the optical fibers. It may even be necessary to exceed the minimum bend radius of the optical fiber to couple it to the transmitter or receiver.

The present invention overcomes this problem by allowing the transmitter 32 and receiver 34 or other opto-electronic device to be mounted and secured directly to the printed circuit board 1, off the support 2 and at a level below it, so that valuable space is not taken up on the support by the transmitter 32 and receiver 34 and a rather large, elongated oval raceway 6 may be formed.

To accomplish this and to support the optical fiber 8 as it descends from the raised raceway 6 to the transmitter 32 and receiver 34 mounted on the printed circuit board 1, the arrangement of the present invention includes one or more entrance ramps 36 and exit ramps 38. The entrance and exit ramps 36, 38 are joined to the bottom wall 16 of the raceway and extend from the raceway 6 substantially to the surface of the printed circuit board 1.

More specifically, the entrance and exit ramps 36, 38 preferably include two opposite sidewalls 40 and a planar bottom wall 42 joined to the lower edges of the sidewalls 40. The bottom walls 42 and sidewalls 40 of the ramps respectively join the bottom wall 16 and inner and outer sidewalls 12, 14 of the raceway. The ramp bottom wall 42 extends from the raceway 6 at a downward slope toward the printed circuit board surface and terminates in a free end 44 which either contacts the surface of the printed circuit board 1 or is close to the surface. The sidewalls 40 of the ramps preferably mutually diverge in a direction from the raised raceway 6 to the printed circuit board 1 to define a widened free end 44. The widened free ends 44 of the ramps provide some latitude in the placement and positioning of the transmitter 32 and receiver 34 on the printed circuit board 1 so that the optical fiber 8 may be properly aligned or angled with minimal bend in relation to the ramp and supported by the sidewalls 40 or bottom wall 42 of the ramp.

Another entrance ramp 46 is positioned between the raceway 6 and two optical fiber connectors 48 mounted on an L-shaped bracket 50 resting on its edge and affixed to the printed circuit board 1. Again, this entrance ramp 46 includes two opposite sidewalls 52 and a bottom wall 54 joined to the lower edges of the sidewalls 52. The entrance ramp 46 extends from near the ends of the connectors 48 to the raceway 6 to support the optical fibers 8 coupled to the connectors and received by the raceway. This ramp need not extend to the surface of the printed circuit board 1 but rather preferably extends to a level where the optical fibers 8 join the connectors 48 so that the fibers are supported by the bottom wall 54 or sidewalls 52 of the ramp during their transition from the connectors to the raceway 6. The sidewalls 52 of this entrance ramp also are mutually diverging from the raceway 6 to the connectors 48 to define a widened free end 56, and one or more of the sidewalls 52 may have a curvature to help guide the optical fibers 8 from the connectors to the raceway. The curvature is selected so as not to exceed the minimum bend radius of the optical fibers.

As can be seen from FIGS. 1 and 2 of the drawings, the entrance and exit ramps 36, 38, 46 and the raceway 6 form one continuous channel for supporting the optical fibers over almost their entire length.

The support 2 also preferably includes a plurality of pairs of tabs 58 spaced periodically along the raceway 6. The tabs 58 of each pair extend toward one another over the raceway from upper portions of the opposite inner and outer sidewalls 12, 14, and are separated from each other by a small gap 60 angled transversely and partially across the width of the raceway 6. The optical fibers 8 are received by the raceway through the gap 60 between tab pairs, and the tabs 58 retain the optical fibers in place but also allow their removal.

Figure 4:
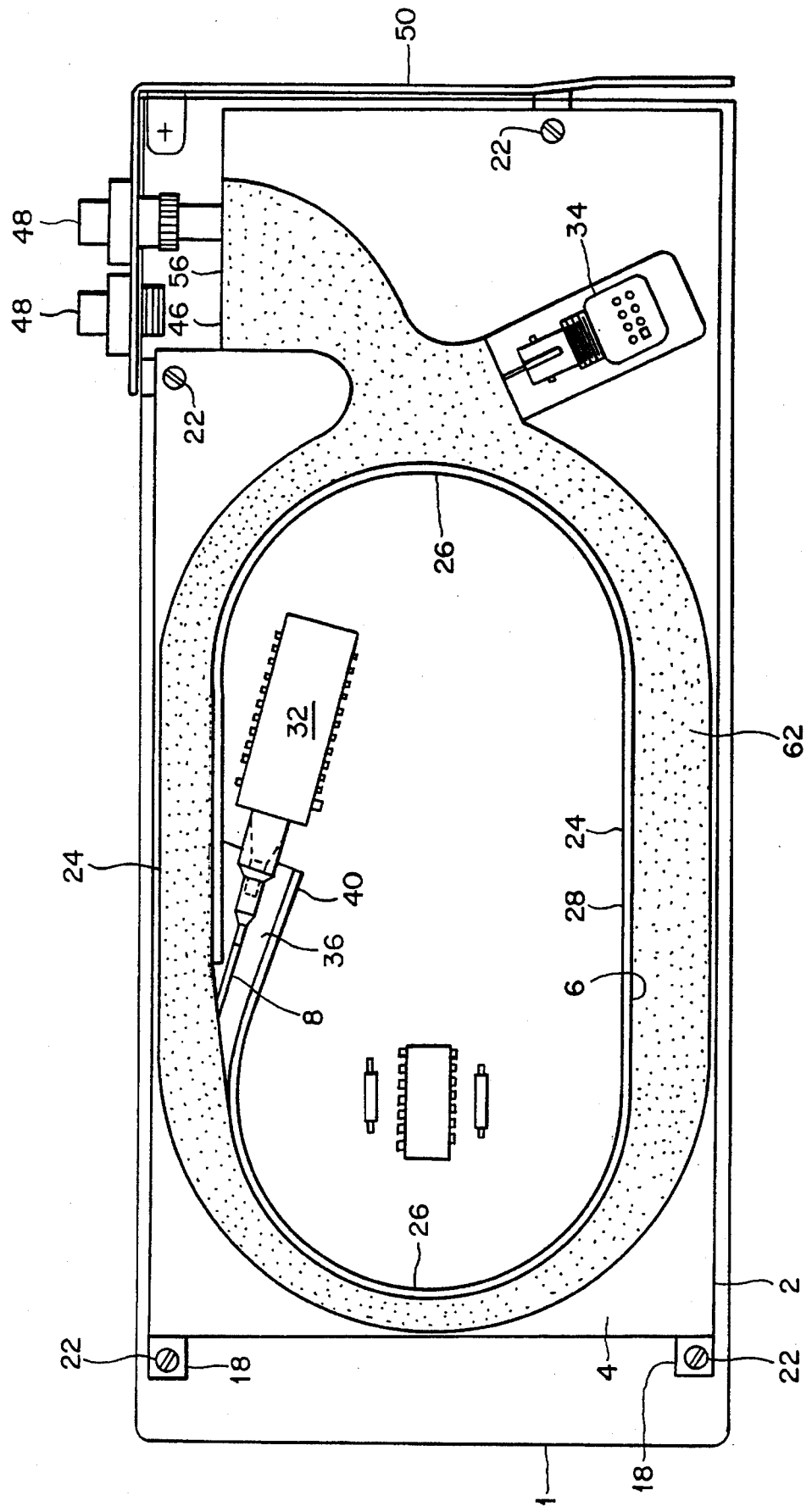

The arrangement further includes a cover 62. The cover may be in the form of a planar sheet of plastic material which covers the entire top surface 4 of the support and which may removably held in place by screws 22 or the like, or may be a plastic or other sheet material which is removably press-fitted between the inner and outer sidewalls 12, 14 of the raceway over the retaining tabs 58, as shown in FIG. 4, which tabs are preferably positioned in the raceway 6 slightly below the upper surface 4 of the support to accommodate the press-fitted cover 62. In either form, the cover 62 at least partially covers the raceway 6.

As can be seen from the above description, the arrangement of the present invention supports an optical fiber 8 and related optical components 10 above the surface of a printed circuit board 1 to provide more space on the printed circuit board for electronic circuitry. The arrangement also allows the opto-electronic transmitter 32 and receiver 34 to be secured directly to the printed circuit board so that there is more room on the optical fiber support 2 for a larger raceway 6.

The arrangement also provides three dimensional support for the optical fibers 8 by way of the raceway 6 and entrance and exit ramps 32, 34, 46. The raceway supports the optical fibers above the circuitry on the printed circuit board, and the ramps support the fibers during their transition from the raised raceway 6 to the transmitter 32 and receiver 34 mounted on the printed circuit board.

Although the optical fiber support 2 is described for use with a printed circuit board 1, it should be realized that the arrangement is suitable for supporting optical fibers and related components above any surface, curved or flat, where space is a design constraint. Additionally, it should be understood that, although the preferred arrangement includes a raceway 6, different structures for securing the optical fibers 8 above a surface and for providing support for the fibers as they descend to the surface are envisioned to be within the scope of the invention.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An optical fiber support for supporting an optical fiber in a raised position above a surface, which comprises:

means defining an optical fiber guiding raceway for receiving and guiding an optical fiber;

means for supporting the raceway defining means above the surface; and at least one of an exit ramp and an entrance ramp, the at least one of an exit ramp and an entrance ramp being joined to the raceway and extending from the raceway substantially to the surface above which the raceway defining means is supported, the at least one of an exit ramp and an entrance ramp providing support for the optical fiber from the raceway to the surface.

2. An optical fiber support as defined by claim 1, which further comprises means for selectively retaining the optical fiber within the raceway.

3. An optical fiber support as defined by claim 1, which further comprises means for selectively retaining an optical component coupled to the optical fiber within the raceway.

4. An optical fiber support as defined by claim 3, wherein the raceway is formed with a widened portion, and the optical component retaining means is disposed within the widened portion.

5. An optical fiber support as defined by claim 1, wherein the at least one of an exit ramp and an entrance ramp includes opposite sidewalls which mutually diverge from the raceway to the surface.

6. An optical fiber support as defined by claim 1, wherein the at least one of an exit ramp and an entrance ramp includes opposite sidewalls, at least one of the sidewalls having a predetermined curvature, the curvature being selected such that the curvature is at most equal to the minimum bend radius of the optical fiber.

7. An optical fiber support as defined by claim 1, wherein the raceway is in the form of an endless oval loop having a predetermined curvature, the curvature being selected such that the curvature is at most equal to the minimum bend radius of the optical fiber.

8. An optical fiber support as defined by claim 1, which further comprises a cover, the cover being mounted on the raceway defining means to at least partially cover the raceway.

9. An optical fiber support for supporting an optical fiber in a raised position above a surface, which comprises:

means for securing an optical fiber;

means for supporting the optical fiber securing means above the surface; and at least one of an exit ramp and an entrance ramp, the at least one of an exit ramp and an entrance ramp being joined to the optical fiber securing means and extending from the securing means substantially to the surface above which the securing means is supported, the at least one of an exit ramp and an entrance ramp providing support for the optical fiber from the securing means to the surface.

10. An optical fiber support for supporting an optical fiber in a raised position above the surface of a printed circuit board on which electrical components are mounted, the surface of the printed circuit board residing substantially in a first plane, which comprises:

means defining an optical fiber guiding raceway for receiving and guiding an optical fiber, the raceway residing substantially in a second plane disposed parallel to the first plane of the printed circuit board surface and spaced apart therefrom;

means for supporting the raceway defining means in spaced apart relation to the printed circuit board surface; and at least one of an exit ramp and an entrance ramp, the at least one of an exit ramp and an entrance ramp being joined to the raceway and extending therefrom substantially to the surface of the printed circuit board and residing substantially in a plane which is transverse to the first and second planes of the raceway and printed circuit board surface, respectively, and providing support for the optical fiber from the raceway to the printed circuit board surface.

* * * * *